（12） United States Patent
Nakamura

(10) Patent No.: US 6,406,941 B2
(45) Date of Patent: Jun. 18, 2002

(54) SOLID-STATE IMAGING DEVICE AND MANUFACTURING METHOD THEREOF

(75) Inventor: Masao Nakamura, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/757,719

(22) Filed: Jan. 10, 2001

(30) Foreign Application Priority Data

Mar. 22, 2000 (JP) ........................................ 2000-080370

(51) Int. Cl.[7] .......................... H01L 21/44; H01L 21/48; H01L 21/50
(52) U.S. Cl. ........................................ 438/116; 438/106
(58) Field of Search .............................. 438/26, 48, 51, 438/64, 68, 106, 113, 116, 460, 611, 617

(56) References Cited

U.S. PATENT DOCUMENTS 5,012,386 A * 4/1991 McShane et al. ............ 361/386
5,450,287 A * 9/1995 Ujiie .......................... 361/760

FOREIGN PATENT DOCUMENTS

JP          06-204442        7/1994

OTHER PUBLICATIONS

U.S. application No. 09/767,214, Nakamura, filed Jan. 22, 2001.

* cited by examiner

*Primary Examiner*—David Nelms
*Assistant Examiner*—David Nhu
(74) *Attorney, Agent, or Firm*—Dike, Bronstein, Roberts & Cushman IP Property Group; David G. Conlin; William J. Daley, Jr.

(57) ABSTRACT

After forming an insulating layer over the entire surface of a transparent substrate, a wiring layer having a predetermined pattern is formed on the insulating layer. After forming the wiring layer, a portion of the insulating layer thus formed corresponding to a light receiving area of a solid-state imaging element is removed to provide an aperture for the insulating layer and to uncover a surface of a light receiving area of the transparent substrate. Thereafter, the solid-state imaging element is bonded with the wiring layer and a gap between the transparent substrate and the solid-state imaging element is sealed by a sealing resin, thereby inexpensively providing a high-quality solid-state imaging device and a manufacturing method thereof, capable of preventing adhesion of foreign objects on a light receiving surface.

10 Claims, 12 Drawing Sheets

FIG.13 (a) (PRIOR ART)
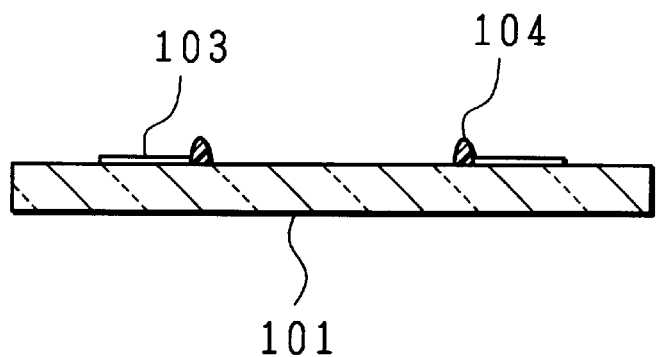
FIG.13 (b) (PRIOR ART)
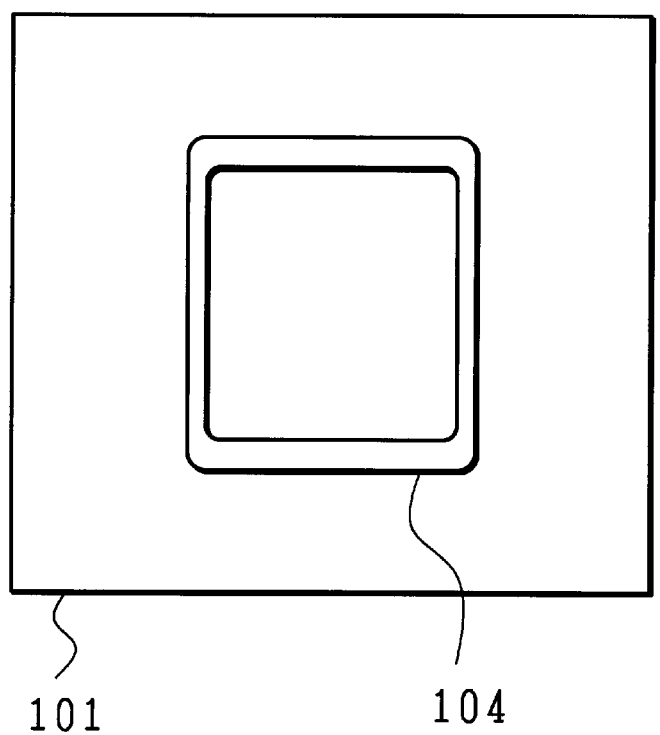

SOLID-STATE IMAGING DEVICE AND MANUFACTURING METHOD THEREOF

FIELD OF THE INVENTION

The present invention relates to a solid-state imaging device which employs a face-down bonding technique for mounting a solid-state imaging element, and a manufacturing method thereof.

BACKGROUND OF THE INVENTION

An example of a conventional solid-state imaging device is a solid-state imaging device taught in Japanese Unexamined Patent Publication No. 204442/1994 (Tokukaihei 6-204442) (published date: Jul. 22, 1994). FIG. 11 shows a schematic structure of this solid-state imaging device, and FIG. 12 through FIG. 15 show a manufacturing method thereof.

As shown in FIG. 11, the solid-state imaging device has the structure wherein a glass substrate 101 is bonded by a conductive adhesive 106 with a solid-state imaging element 102 which has been provided with projecting electrodes 105, and a gap between the glass substrate 101 and the solid-state imaging element 102 is sealed by a sealing resin 107, leaving a light receiving area 102a. On the glass substrate 101 are formed a group of electrode terminals 103 for outputting electrical signals and a projecting frame 104 of insulating resin on and around the group of electrode terminals 103.

In the manufacturing method of the foregoing solid-state imaging device, in the first step, as shown in FIG. 12, the conductive adhesive 106 is applied by a transfer method over the projecting electrodes 105 provided on the solid-state imaging element 102.

Then, in the second step, as shown in FIG. 13(a) and FIG. 13(b), a metal film such as copper (Cu) is formed by a vapor deposition method on the glass substrate 101, and the electrode terminals 103 are formed by patterning the metal film in the form of wiring, and then the projecting frame 104 is formed by a printing method using a paste whose main ingredient is an epoxy material.

In the subsequent third step, as shown in FIG. 14, the solid-state imaging element 102 to which the conductive adhesive 106 was transferred is bonded with the glass substrate 101 having provided with the projecting frame 104 by printing the epoxy material in the second step, and heat is applied by a heating device so as to set the conductive adhesive 106 and the projecting frame 104.

Finally, in the fourth step, as shown in FIG. 15, the sealing resin 107 is allowed to penetrate to the area of a gap between the solid-state imaging element 102 and the glass substrate 101 around the outer periphery of the projecting frame 104, which is then set by heating it using a heating device.

The solid-state imaging device is used to convert the incident light on the glass substrate 101 into electrical signals by the solid-state imaging element 102 so as to output the electrical signals in the form of image signals to outside via the projecting electrodes 105 and the electrode terminals 103.

In the foregoing solid-state imaging device, when foreign objects stick to a light incident area, i.e., the light receiving area 102a, the foreign objects block the incident light and appear as black spots in the output image. Therefore, manufacture of the solid-state imaging device requires a strict measure against foreign objects for preventing adhesion of foreign objects on the light receiving area 102a.

Specifically, such a measure can be implemented, for example, by (1) manufacturing the solid-state imaging device in a clean environment where foreign objects are strictly managed, (2) providing an additional step of removing the adhered foreign objects, or (3) by avoiding handling or operation on the light receiving surface in the manufacturing process.

However, the foregoing prior art required operation on the light receiving surface in the step of transferring the conductive adhesive 106 with respect to the projecting electrodes 105 provided on the solid-state imaging element 102, and also in the step of printing the projecting frame 104 with respect to the glass substrate 101, which posed the risk of foreign objects being stuck during the operation.

Further, the resin making up the conductive adhesive 106 and projecting frame 104 is set by heating using a heating device after mounting the solid-state imaging element 102 and the glass substrate 101 together. Thus, immediately after the transfer of the conductive adhesive 106 onto the solid-state imaging element 102 or printing the projecting frame 104 on the glass substrate 101, the conductive adhesive 106 and the projecting frame 104 have not been set yet, which prevented providing the step of removing foreign objects even when presence of the foreign objects was observed on the light receiving surface of the solid-state imaging element 102 and/or glass substrate 101, thus failing to remove the foreign objects once they stick to the light receiving surface.

Further, even though the manufacturing method of the solid-state imaging device under clean environment is applicable to the foregoing conventional solid-state imaging device, it requires a manufacturing process in a clean room where foreign objects are strictly managed, thus posing the problem of high facility cost.

Further, in the foregoing solid-state imaging device, because the metal film is formed directly at the interface with the glass substrate 101, it requires a very sophisticated technique of patterning the metal film into wiring of the group of electrode terminals 103 (process in which the metal film is etched by dry etching to the interface between the glass substrate 101 and the metal film but without reaching the interface, and then removing the remaining metal film by wet etching without damaging the interface in the light receiving area of the glass substrate 101.

SUMMARY OF THE INVENTION

It is an object of the present invention to inexpensively provide a high-quality solid-state imaging device and a manufacturing method thereof by way of preventing adhesion of foreign objects on a light receiving surface.

In order to achieve this object, a manufacturing method of a solid-state imaging device of the present invention includes the steps of forming an insulating layer on a transparent substrate (insulating layer forming step); forming a wiring layer having a predetermined pattern on the insulating layer (wiring layer forming step); uncovering a surface of a light receiving area of the transparent substrate after forming the wiring layer by removing a portion of the insulating layer formed in the insulating layer forming step corresponding to a light receiving area of a solid-state imaging element (insulating layer removing step); and bonding the solid-state imaging element with the wiring layer so as to mount the solid-state imaging element on the transparent substrate (bonding step).

According to this method, the light receiving surface of the transparent substrate is covered with the insulating layer in the insulating layer forming step, and the light receiving surface of the transparent substrate is protected by the insulating layer during handling and operation in the subsequent wiring layer forming step. Further, in the insulating layer removing step immediately before the step of bonding the solid-state imaging element with the transparent substrate, a portion of the insulating layer corresponding to the light receiving area of the solid-state imaging element is removed so as to uncover the surface of the light receiving area of the transparent substrate.

As a result, foreign objects which might have stuck to the portion of the insulating layer corresponding to the light receiving area of the solid-state imaging element in the wiring layer forming step are removed together with the insulating layer in the subsequent insulating layer removing step. Therefore, with the foregoing manufacturing method, operations which might pose the risk of sticking foreign objects during the manufacturing process can be eliminated as much as possible to realize a manufacturing process of high productivity, thereby inexpensively providing a high-quality solid-state imaging device for products which incorporate solid-state imaging devices, for which demand for reducing the size and thickness has not been higher.

Further, the wiring layer formed in the wiring forming step is formed on the transparent substrate via the insulating layer which is formed in the insulating layer forming step, instead of directly forming it on the transparent substrate. Thus, it is possible to easily carry out patterning without damaging the surface of the light receiving area of the transparent substrate in patterning of wiring of the wiring layer, thus obtaining desirable adhesion between the transparent substrate and the wiring layer.

For a fuller understanding of the nature and advantages of the invention, reference should be made to the ensuing detailed description taken in conjunction with the accompanying drawings.

BRIEF DESCRIPTION OF THE DRAWINGS

FIG. 13($a$) and FIG. 13($b$) are explanatory drawings showing a step of forming a projecting frame on a transparent substrate in the manufacturing process of the conventional solid-state imaging device.

DESCRIPTION OF THE EMBODIMENTS

The following will describe one embodiment of the present invention with reference to the drawings.

Figure 1:
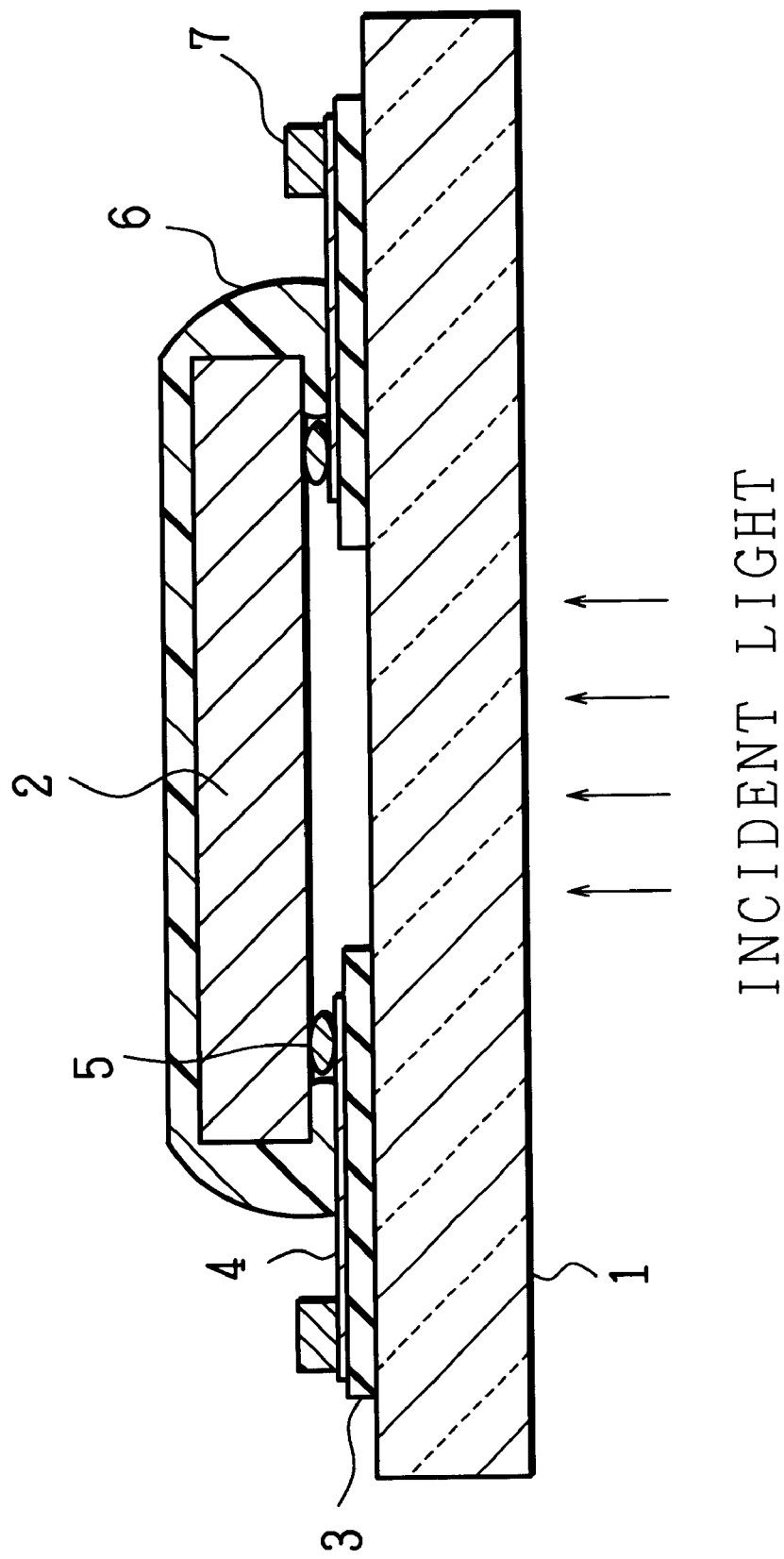
FIG. 1 is a cross sectional view showing a structure of a solid-state imaging device in accordance with one embodiment of the present invention.
Figure 2:
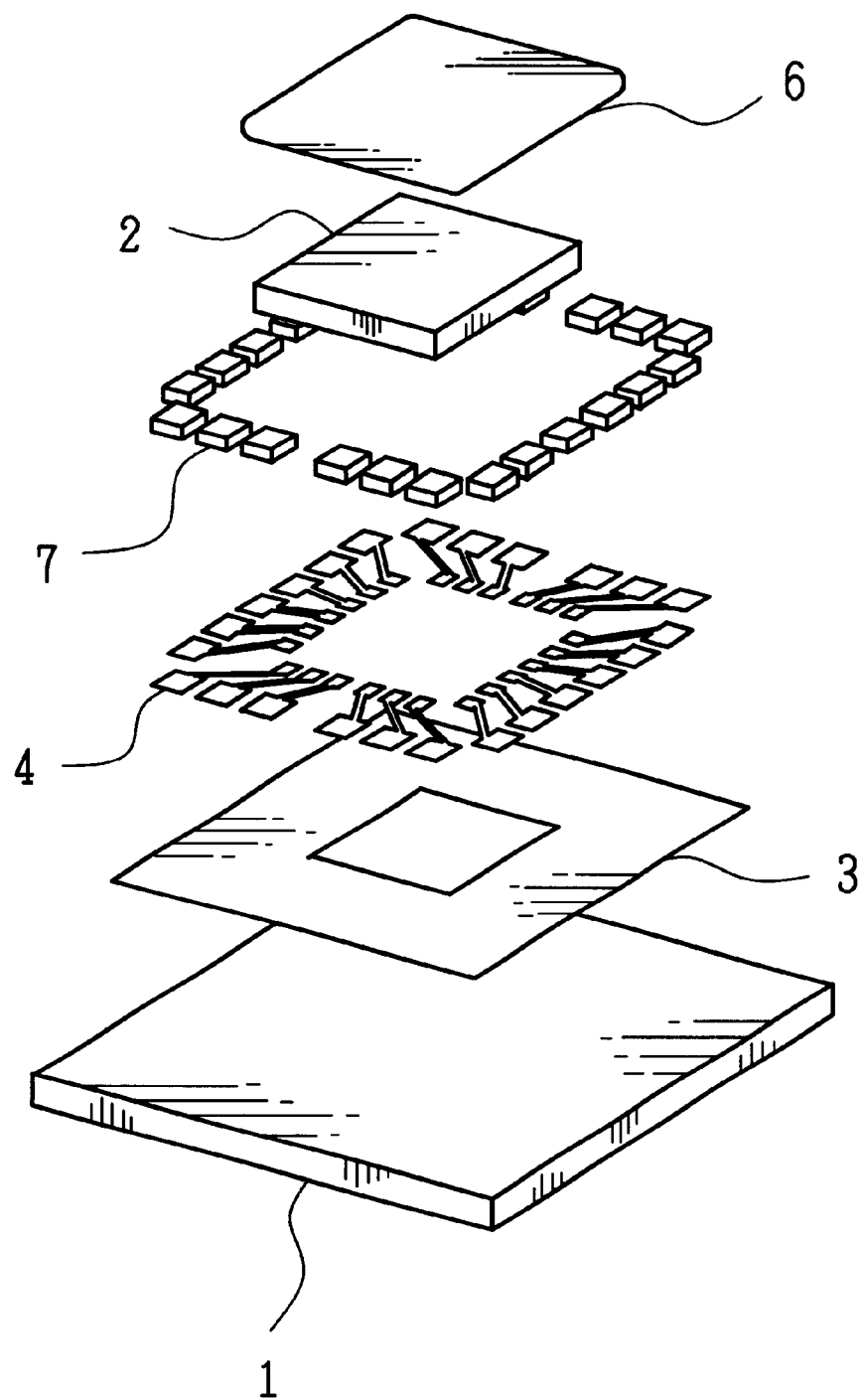
FIG. 2 is an exploded perspective view of the solid-state imaging device as shown in FIG. 1.

FIG. 1 and FIG. 2 show schematic structures of a solid-state imaging device in accordance with the present embodiment, in which FIG. 1 is a cross sectional view and FIG. 2 is an exploded perspective view.

The solid-state imaging device is made by bonding a transparent substrate 1 made of glass, optical film, and the like, with a solid-state imaging element 2 thereon. The transparent substrate 1 includes an insulating film 3 having an aperture corresponding to a light receiving area of the solid-state imaging element 2, and wiring (wiring layer) 4 which has been patterned on the insulating film 3. The solid-state imaging element 2 includes projecting electrodes 5 for connecting the solid-state imaging element 2 to the wiring 4. The transparent substrate 1 and the solid-state imaging element 2 are bonded with each other such that inner terminals of the wiring 4 are in contact with the projecting electrodes 5 and the gap between the transparent substrate 1 and the solid-state imaging element 2 on the outer periphery is sealed by a sealing resin 6. Further, on the outer terminals of the wiring 4 are formed projecting electrodes 7 for making the connection to external circuits easier.

Figure 3:
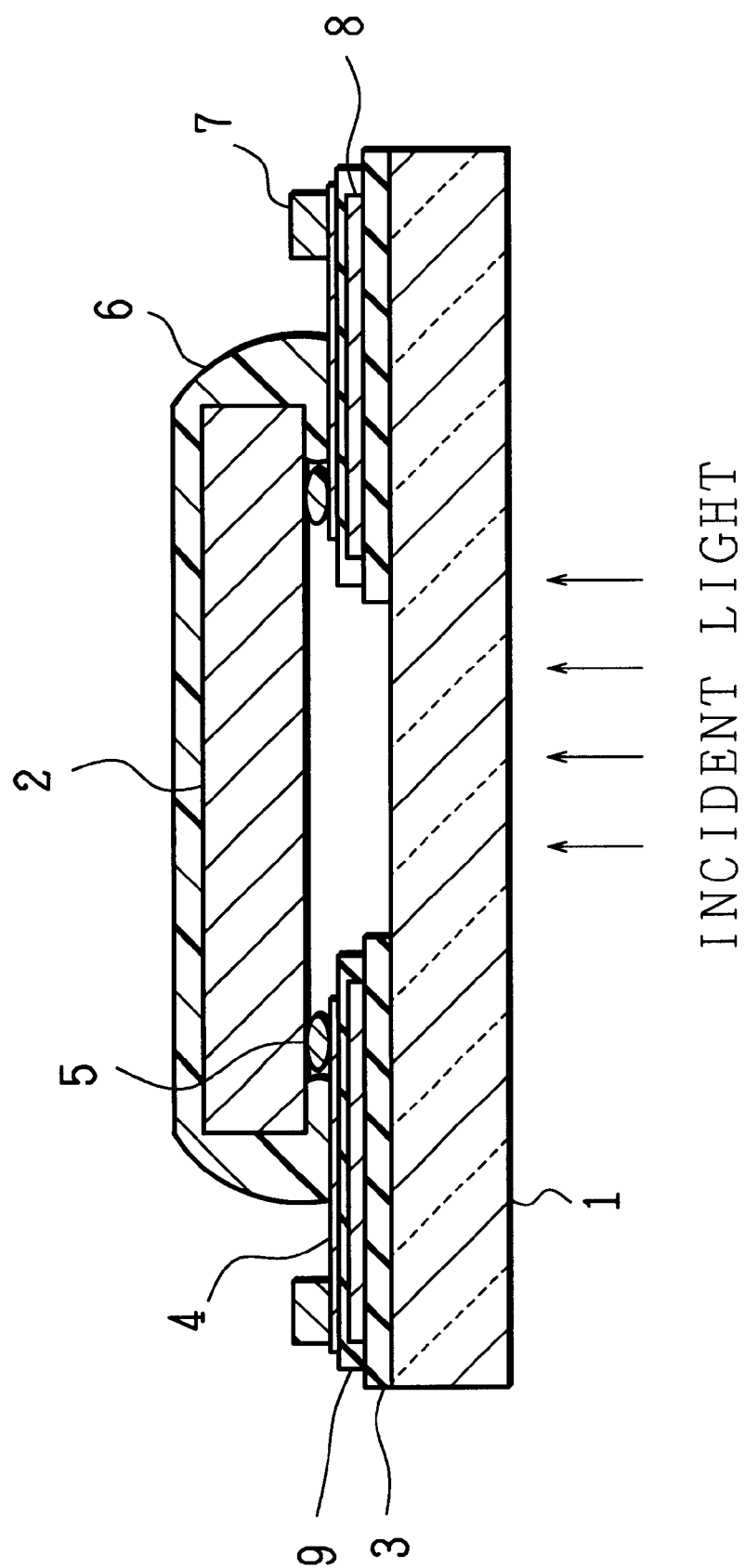
FIG. 3 is a cross sectional view showing a structure of a solid-state imaging device in accordance with another embodiment of the present invention.
Figure 4:
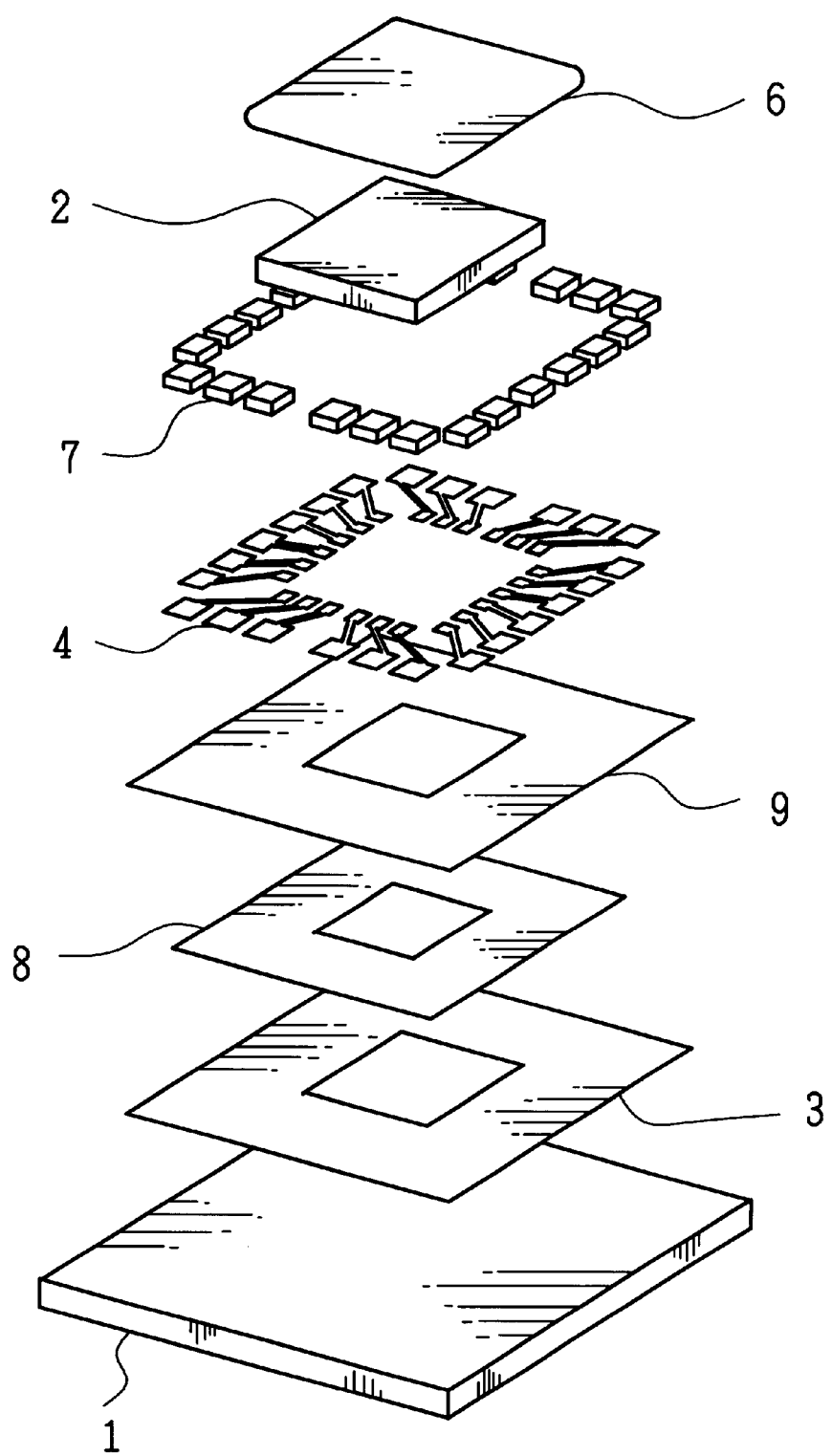
FIG. 4 is an exploded perspective view of the solid-state imaging device as shown in FIG. 3.

In the solid-state imaging device shown in FIG. 1 and FIG. 2, it is assumed that the solid-state imaging element 2 has a light-shielding metal film (not shown). However, in the case where the solid-state imaging element 2 does not have the light-shielding metal film, the light-shielding metal film may be provided on the transparent substrate 1, as shown in FIG. 3 and FIG. 4. That is, instead of forming the wiring 4 on the insulating film 3 of the transparent substrate 1, the light-shielding metal film 8 is formed on the insulating film 3, and further the insulating film 9 thereon. The wiring 4 is then formed on the insulating film 9. Note that, as with the metal film 3, the light-shielding metal film 8 and the insulating film 9 have apertures corresponding to the light receiving area of the solid-state imaging element 2.

The following advantages can be obtained by providing the light-shielding metal film 8 on the transparent substrate 1.

First, by providing the light-shielding metal film 8 on the transparent substrate 1, the process of forming the light-shielding metal film on the solid-state imaging element 2 can be omitted in the manufacturing process of the solid-state imaging element 2. This reduces the manufacturing cost of the solid-state imaging element 2 and the risk of dusts sticking to the light receiving surface of the solid-state imaging element 2 in the process of forming the light-shielding metal film on the solid-state imaging element 2.

Further, by placing the light-shielding metal film 8 made of TiW or other material under the wiring 4, the alignment marks which were formed when forming the wiring 4 can be contrasted with the light-shielding metal film 8 (the alignment marks are made of Al as with the wiring 4, and the two metal films have different reflectance), and therefore, in the step of bonding the transparent substrate 1 with the solid-state imaging element 2, no error will occur in recognizing the edges when the alignment marks are recognized in image recognition, thereby realizing accurate bonding.

Further, by partially blanking the light-shielding metal film 8, it is possible to provide a mark of a reference pin position which is used for positioning the solid-state imaging element 2 and the transparent substrate 1 when bonding the two, thereby omitting a step of providing the reference pin mark in the manufacturing process.

Figure 5:
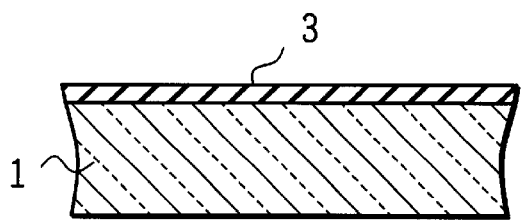
FIG. 5($a$) through FIG. 5($i$) are explanatory drawings showing manufacturing steps on a transparent substrate of the solid-state imaging device of FIG. 3.
Figure 5:
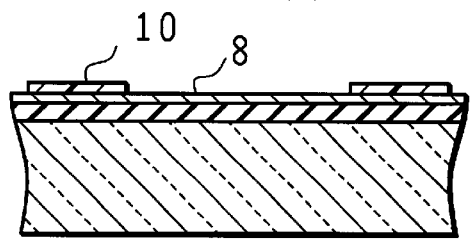
Figure 5:
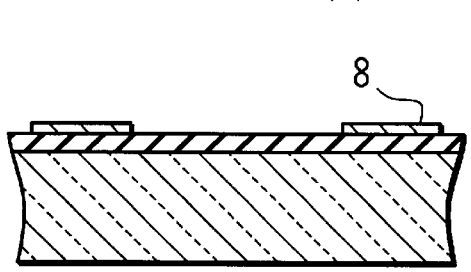
Figure 5:
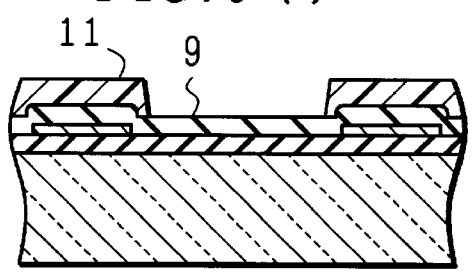
Figure 5:
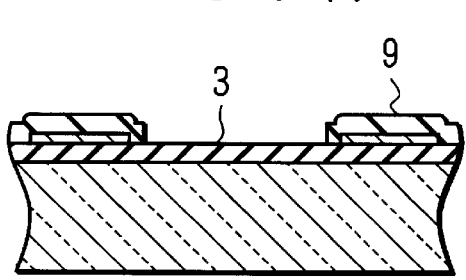
Figure 5:
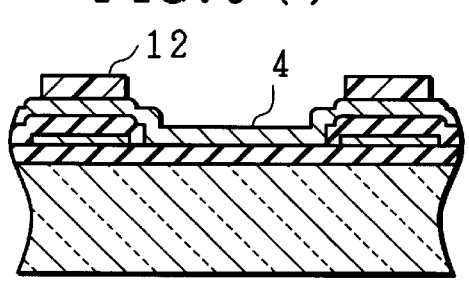
Figure 5:
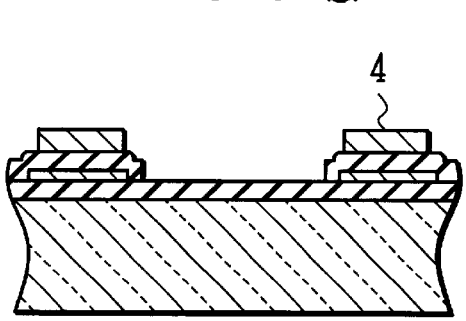
Figure 5:
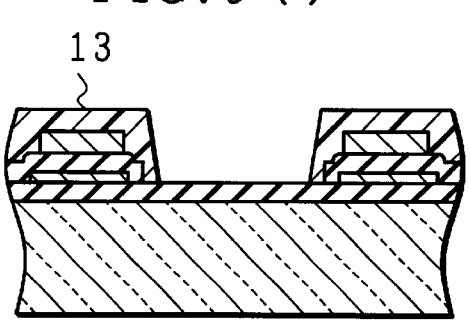
Figure 5:
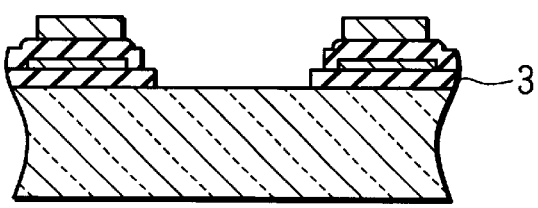

The following will describe a manufacturing method of the solid-state imaging device referring to FIG. 5(*a*) through FIG. 5(*i*). Note that, the following description will be given through the case of manufacturing a solid-state imaging device having the light-shielding metal film 8 on the transparent substrate 1.

In the first step, as shown in FIG. 5(*a*), an oxide film such as $SiO_2$ or nitride film such as SiN is formed as an insulating film 3' in the thickness of 500 nm to 1000 nm by the CVD (Chemical Vapor Deposition) method or PVD (Physical Vapor Deposition) method on the transparent substrate 1 of a transparent plate such as glass or an optical filter having the thickness of 0.5 mm to 0.7 mm. The insulating film 3' will become the insulating film 3 having an aperture corresponding to the light receiving area by being etched in the subsequent step. However, etching is not carried out at this stage and the light receiving area of the transparent substrate 1 is protected by the insulating film 3' until wire patterning is finished. By forming the insulating film 3' on the transparent substrate 1, desirable adhesion can be obtained between the transparent substrate 1 and the metal film formed thereon, such as wiring.

Then, in the second step, as shown in FIG. 5(*b*), a metal thin film 8' made of TiW or WSi, which later becomes the light-shielding metal film 8, is deposited in the thickness of 100 nm to 200 nm by the CVD method or PVD method, and a pattern of photoresist 10 is formed on the light-shielding area. Then, as shown in FIG. 5(*c*), unnecessary portions of the metal thin film is removed by dry etching or wet etching so as to form the light-shielding metal film 8. Note that, here, a portion of the metal thin film outside the portion which is faced with the solid-state imaging element 2 when they are bonded may be partially removed when removing a portion corresponding to the light-shielding area by partially blanking the pattern of the photoresist 10 in the light-shielding area so as to provide a reference pin mark.

After forming the light-shielding metal film 8, in the third step, as shown in FIG. 5(*d*), an oxide film such as $SiO_2$ or nitride film such as SiN, which becomes the insulating film 9, is deposited as an insulating film 9' in the thickness of 500 nm to 1000 nm by the CVD method or PVD method, and a pattern of photoresist 11 is formed in a wiring region which is later deposited in the subsequent step. Then, as shown in FIG. 5(*e*), unnecessary portions of the insulating film 9' are removed by dry etching to form the insulating film 9. In etching the insulating film 9', the insulating film 3' which was deposited in the first step is not etched so as to protect the portion corresponding to the light receiving area of the solid-state imaging element 2 till wire patterning is finished.

Note that, the second and third steps are required to form the light-shielding metal film 8, and they are omitted in the manufacturing process of the solid-state imaging device which does not have the light-shielding metal film 8 as shown in FIG. 1 and FIG. 2.

In the subsequent fourth step, as shown in FIG. 5(*f*), an alloyed metal material is deposited as a wiring metal film 4' in the thickness of 1000 nm to 10000 nm by sputtering, which is one form of the PVD method, and then a desired patten of photoresist 12 is formed on the wiring metal film 4'. Then, as shown in FIG. 5(*g*), unnecessary portions of the wiring metal film 4' are removed by dry etching to form the wiring 4. Note that, the alloyed metal material is Al—Si or Al—Si—Cu, etc., which contains aluminium as the main component and which is commonly used as the wiring material of semiconductor elements, etc. Further, the reason sputtering is used to deposit the wiring metal film 4' is that, unlike other methods including the vapor deposition method, it allows deposition at low temperatures without heating the target material to a melting temperature and therefore is desirable to obtain a metal film having less residual stress.

Finally, in the fifth step, as shown in FIG. 5(*h*), a pattern of photoresist 13 is formed over a portion other than the portion corresponding to the light receiving area of the solid-state imaging element 2 so as to patten the insulating film 3'. Then, in order to remove unnecessary portions of the insulating film 3' without damaging the interface in the light receiving area of the transparent substrate 1, the light receiving area is made into an aperture by wet etching, thus forming the insulating film 3.

With this method, since the unnecessary portions of the insulating film 3' to make up the light receiving area of the solid-state imaging element 2 are removed immediately before mounting the solid-state imaging element 2 on the transparent substrate 1, foreign objects on the insulating film 3' can be removed together even when they have stuck to the insulating film 3' during the manufacturing process of the wiring 4 and other elements. After the etching process of the insulating film 3', there is no process which requires handling or operation on the light receiving surface of the transparent substrate 1, thereby minimizing the risk of foreign objects sticking to the light receiving area of the transparent substrate 1 and providing a manufacturing process with less defects caused by foreign objects sticking to the light receiving surface.

Note that, in the foregoing explanations, the first step as shown in FIG. 5(*a*), the fourth step as shown in FIG. 5(*f*) and FIG. 5(*g*), and the fifth step as shown in FIG. 5(*h*) and FIG. 5(*i*) correspond to an insulating layer forming step, wiring layer forming step, and insulating layer removing step, respectively.

The steps of FIG. 5(*a*) through FIG. 5(*i*) on the transparent substrate 1 are carried out with respect to a transparent substrate base material of a rectangular (FIG. 6), circular (FIG. 7), or other shape, which is equivalent to a plurality of transparent substrates 1. As is clear from FIG. 6 and FIG. 7, individual transparent substrates 1 are formed in a matrix with respect to the transparent substrate base material.

Figure 8:
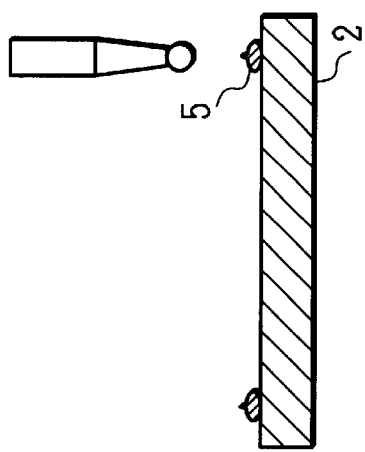
FIG. 8($a$) through FIG. 8($c$) are explanatory drawings showing some of the manufacturing steps after the step of mounting a solid-state imaging element on a transparent substrate.
Figure 8:
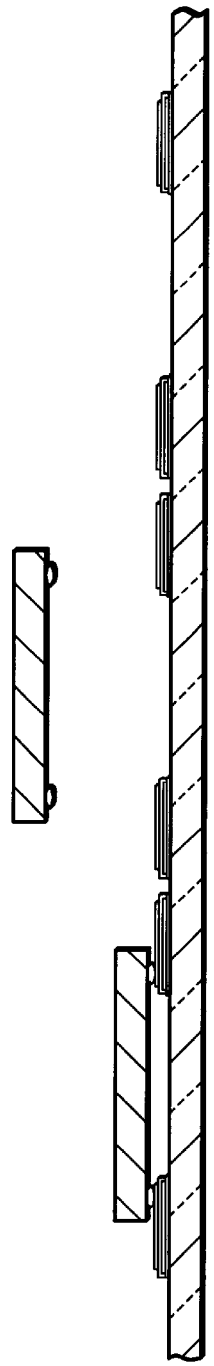
Figure 8:
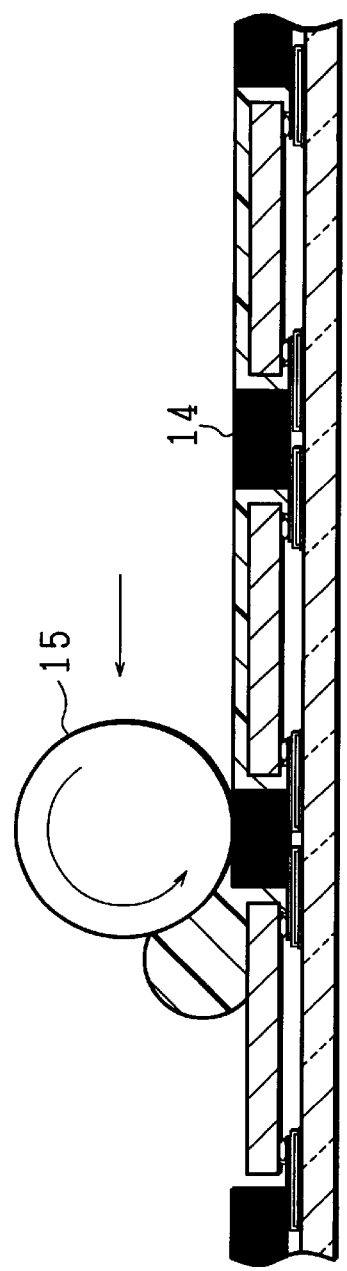
Figure 9:
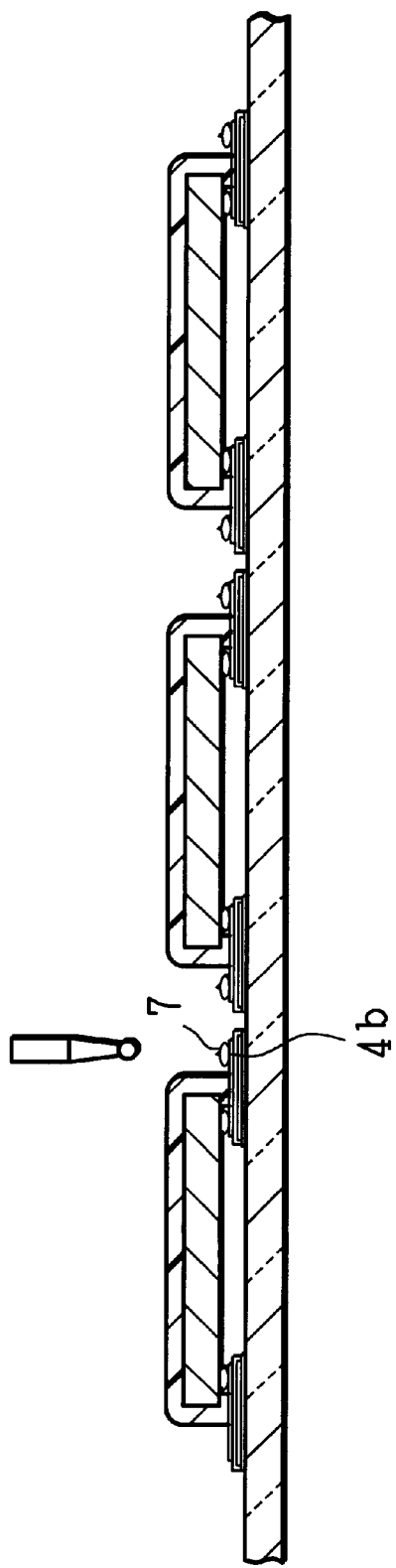
FIG. 9($a$) and FIG. 9($b$) are explanatory drawings showing some of the manufacturing steps after the step of mounting a solid-state imaging element on a transparent substrate.

The following will describe how the solid-state imaging element 2 is mounted on the transparent substrate 1 referring to FIG. 8(*a*) through FIG. 8(*c*), and FIG. 9(*a*) and FIG. 9(*b*).

First, as shown in FIG. 8(*a*), the projecting electrodes 5 are formed on the electrode terminal on the light receiving side by the ball bonding method with respect to the solid-state imaging element 2. The projecting electrodes 5 may alternatively be formed by a plating method in a wafer process for manufacturing the solid-state imaging element 2.

Figure 6:
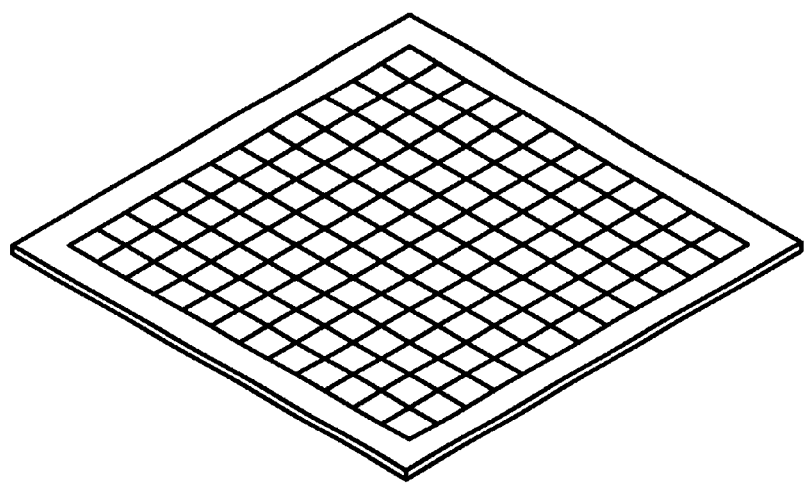
FIG. 6 is a perspective view showing a transparent substrate base material of a rectangular shape on which the solid-state imaging device is formed in a matrix.
Figure 7:
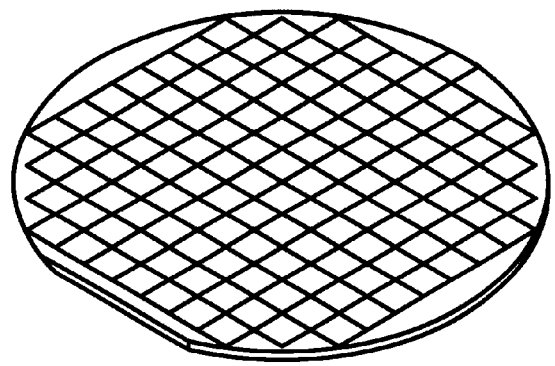
FIG. 7 is a perspective view showing a transparent substrate base material of a circular shape on which the solid-state imaging device is formed in a matrix.
Figure 10:
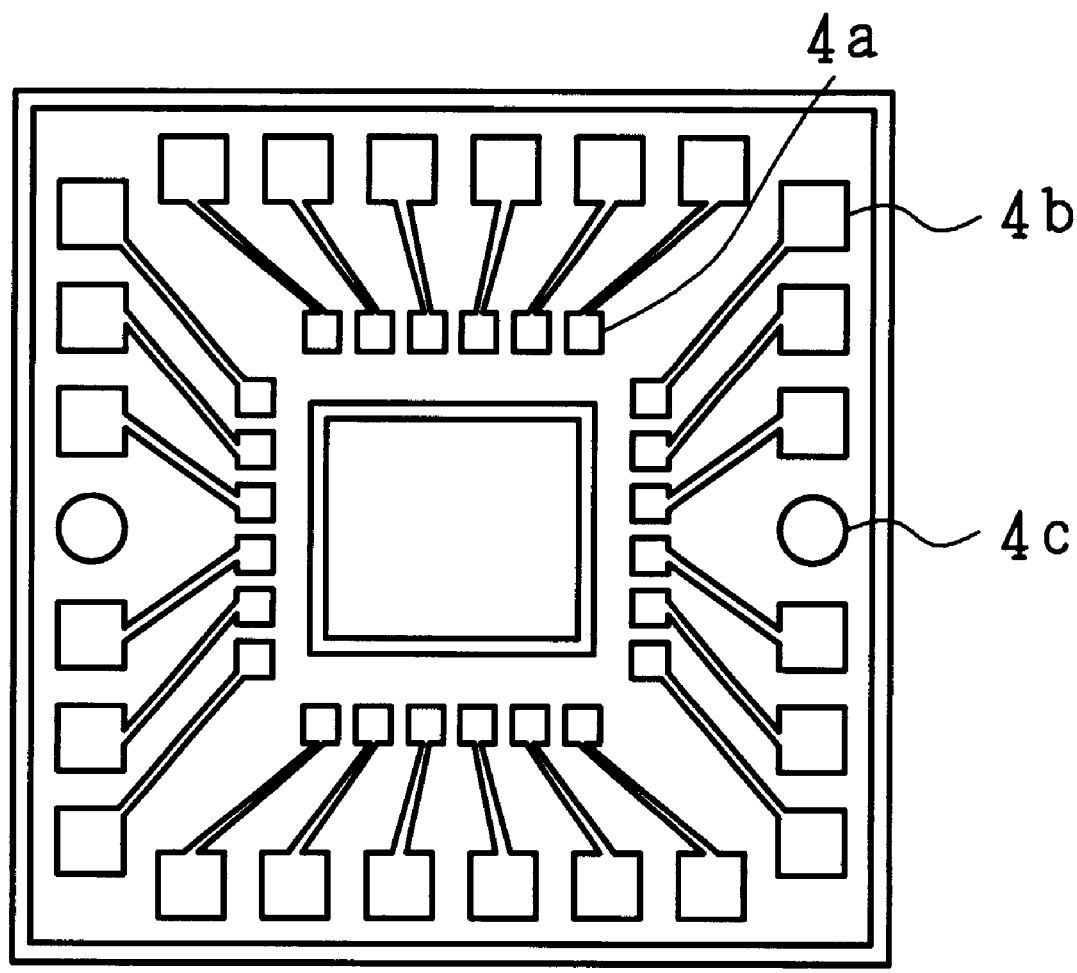
FIG. 10 is a plan view showing an exemplified wiring pattern formed on the transparent substrate.
Figure 11:
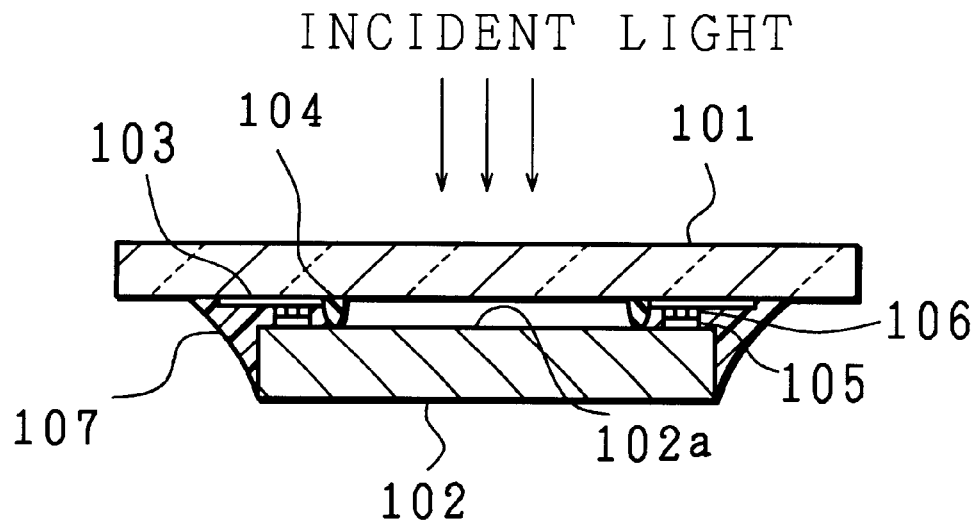
FIG. 11 is a cross sectional view showing a structure of a conventional solid-state imaging device.
Figure 12:
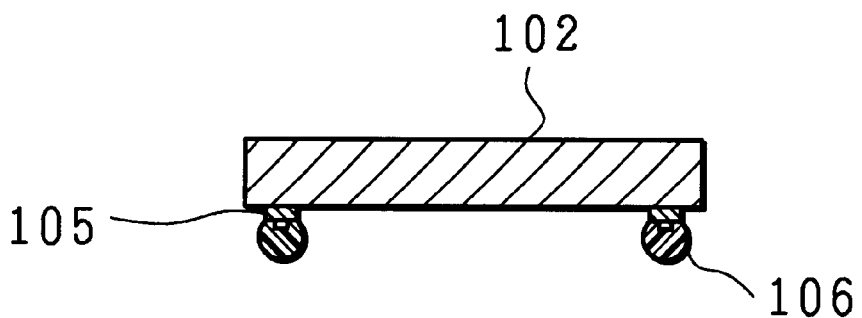
FIG. 12 is an explanatory drawing showing a step of applying a conductive adhesive on a solid-state imaging element in a manufacturing process of the conventional solid-state imaging device.
Figure 14:
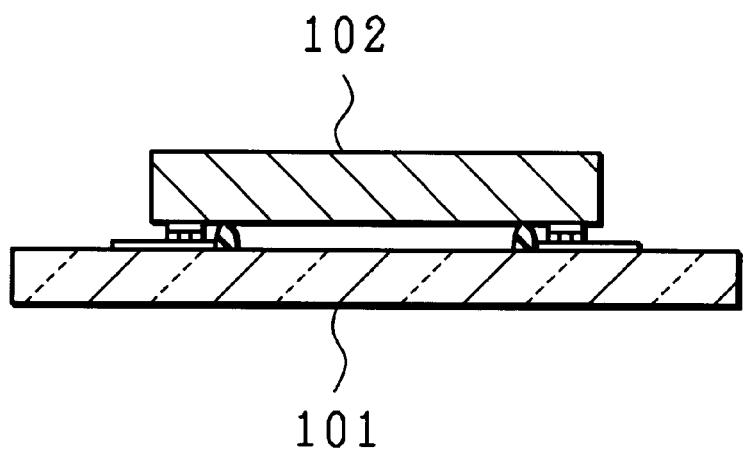
FIG. 14 is an explanatory drawing showing a step of bonding the transparent substrate with the solid-state imaging element in the manufacturing process of the conventional solid-state imaging device.
Figure 15:
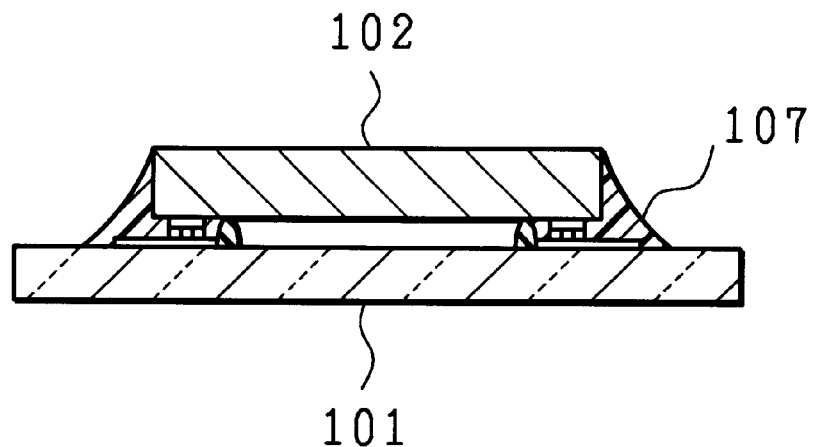
FIG. 15 is an explanatory drawing showing a step of forming a sealing resin around the solid-state imaging element in the manufacturing process of the conventional solid-state imaging device.

Then, on the transparent substrate base material as shown in FIG. 6 or FIG. 7, the solid-state imaging element 2 is mounted with respect to each transparent substrate 1. The solid-state imaging element 2 is mounted so that the projecting electrodes 5 are connected to the wiring 4 of each transparent substrate 1. Here, FIG. 10 shows an exemplified pattern of the wiring 4. The wiring 4 includes a group of inner electrode terminals 4a and a group of outer electrode terminals 4b to be connected to the solid-state imaging element 2, and recognition marks 4c (reference pin position) are provided in the rows of the group of outer electrode terminals 4b. The inner electrode terminals 4a and the outer electrode terminals 4b are connected to each other in one to one correspondence, and the electrical signals in and out of the solid-state imaging element 2 are conducted through the inner electrode terminals 4a and the outer electrode terminals 4b.

To mount the solid-state imaging element 2 on the transparent substrate 1, as shown in FIG. 8(b), the solid-state imaging element 2 is disposed to face the transparent substrate 1 (face-down), which are then alloyed by an ultrasonic connection technique. Here, the step as shown in FIG. 8(b) corresponds to a connecting step.

Note that, positioning of the solid-state imaging element 2 and the transparent substrate 1 when they are bonded is made using the recognition marks 4c as a reference. That is, the recognition marks 4c are alignment marks for aligning the solid-state imaging element 2 with respect to the wiring 4, and alignment marks are also formed on the solid-state imaging element 2. The recognition marks 4c of the wiring 4 are aligned with the alignment marks of the solid-state imaging element 2 by inserting a camera between the solid-state imaging element 2 and the wiring 4, which are then bonded with each other after retrieving the camera. As a result, the projecting electrodes 5 of the solid-state imaging element 2 can be securely connected to the inner electrode terminals 4a of the wiring 4.

Further, the recognition marks 4c can also be used when incorporating the solid-state imaging device in accordance with the present embodiment into a peripheral device. That is, because the recognition marks 4c are formed at a position which is not covered by the sealing resin applied in the subsequent step, they can be used as the recognition marks when incorporating the solid-state imaging device of the present embodiment into other peripheral devices.

Further, while the solid-state imaging element 2 and the transparent substrate 1 may be connected to each other using a conductive adhesive or by other methods applying heat or pressure, etc., low-temperature connection and high throughput can be realized with the ultrasonic connection technique. Low-temperature connection allows easy bonding at a low temperature of around 100° C. at the most since the wiring 4 on the side of the transparent substrate 1 is made of an alloyed material containing aluminium which has a high diffusion coefficient. Also, high throughput is made possible by forming an alloy and finishing the bonding only by applying an ultrasonic wave.

Further, by using the ultrasonic connection technique, instead of the conductive adhesive, for the connection of the solid-state imaging element 2 and the transparent substrate 1, there will be no adhesive which has not been set on the surface of the solid-state imaging element 2 immediately before mounting. This makes it possible to provide a step of removing foreign objects by washing, etc., immediately before mounting the solid-state imaging element 2. As a result, it is possible to minimize the number of foreign objects sticking to the light receiving surface of the solid-state imaging element 2, thereby preventing defects due to adhesion of foreign objects on the light receiving area.

Then, as shown in FIG. 8(c), a mask 14 which has been blanked to have a region slightly larger than each solid-state imaging element 2 is placed over the transparent substrate base material having the solid-state imaging element 2 being mounted on the transparent substrate 1, and the sealing resin 6 having a thermosetting property is applied on the outer periphery of the solid-state imaging element 2 by the printing method. The reason the sealing resin 6 is applied over the entire outer periphery of the solid-state imaging element 2 is to secure sealing of the spacing (light receiving area) formed between the transparent substrate 1 and the solid-state imaging element 2, to have a function of a micro lens for the transparent resin formed on the solid-state imaging element 2 to improve the photo-sensitivity of the solid-state imaging element 2, and to improve reliability against humidity. Here, the step as shown in FIG. 8(c) corresponds to a sealing step.

The thermosetting resin used as the sealing resin 6 is preferably a resin having a viscosity of not less than 150 Pa·s and not more than 250 Pa·s and a thixotropic property. With such a thermosetting resin, the amount of resin which flows into the gap between the solid-state imaging element 2 and the transparent substrate 1 can be controlled by the pressure load of a roller 15 used in printing.

Note that, the sealing resin 6 may be formed by a method other than the printing method, for example, by potting a resin from above. However, in the method of potting the resin, the resin spreads around the solid-state imaging element 2, which becomes a disadvantage in reducing the size of the solid-state imaging device. On the other hand, with the printing method, spreading of resin can be prevented by the mask 14, and it is possible to reduce the size of the solid-state imaging device. However, the viscosity of the sealing resin 6 below 150 Pa·s is too low and the resin spreads through the connected portion of the transparent substrate 1 and the solid-state imaging element 2 onto the surface of the light receiving surface, and the viscosity of the sealing resin 6 exceeding 250 Pa·s is too high and makes the use of the printing method difficult.

Then, as shown in FIG. 9(a), the projecting electrodes 7 are formed by the ball-bonding method with respect to the outer electrode terminals 4b provided on the transparent substrate 1. The projecting electrodes 7 are provided to allow for easy wiring with a peripheral device when the solid-state imaging device is incorporated in other peripheral devices. Finally, as shown in FIG. 9(b), the solid-state imaging device disposed in a matrix on the transparent substrate base material is cut into pieces by dicing to obtain individual solid-state imaging device. Here, the step as shown in FIG. 9(b) corresponds to a dicing process.

The foregoing described the basic manufacturing method of the solid-state imaging device in accordance with the present embodiment. However, yet higher productivity can be obtained by performing an electrical test or imaging test with respect to the transparent substrate base material having the solid-state imaging devices in a matrix form after forming the projecting electrodes 7 with respect to the transparent substrate 1 in the step as shown in FIG. 9(a) and before dicing the solid-state imaging devices in the step as shown in FIG. 9(b).

In the described manufacturing method of the solid-state imaging device, prior to the step (step of FIG. 8(b)) of bonding the transparent substrate 1 with the solid-state imaging element 2, the only handling or operation on the light receiving surface of the transparent substrate 1 or solid-state imaging element 2 is the step of forming the projecting electrodes 5 on the solid-state imaging element 2. Also, in the subsequent steps after bonding the solid-state imaging element 2 with the transparent substrate 1, their light receiving surfaces are facing each other and there is no chance of foreign objects sticking to the light receiving surfaces. Therefore, with the described manufacturing method, the number of processes which might pose the risk of foreign objects sticking to the light receiving surface is reduced as much as possible, thereby minimizing the chance of foreign objects sticking to the light receiving surface.

As described, the manufacturing method of the solid-state imaging device in accordance with the present invention is the method for the solid-state imaging device having the solid-state imaging element being mounted on the transparent substrate, and the method includes the steps of forming an insulating layer on a transparent substrate (insulating layer forming step); forming a wiring layer having a predetermined pattern on the insulating layer (wiring layer forming step); uncovering a surface of a light receiving area of the transparent substrate after forming the wiring layer by removing a portion of the insulating layer formed in the insulating layer forming step corresponding to a light receiving area of a solid-state imaging element (insulating layer removing step); and bonding the solid-state imaging element with the wiring layer (bonding step).

According to this method, the light receiving surface of the transparent substrate is covered with the insulating layer in the insulating layer forming step, and the light receiving surface of the transparent substrate is protected by the insulating layer during handling and operation in the subsequent wiring layer forming step. Further, in the insulating layer removing step immediately before the step of bonding the solid-state imaging element with the transparent substrate, a portion of the insulating layer corresponding to the light receiving area of the solid-state imaging element is removed so as to uncover the surface of the light receiving area of the transparent substrate.

As a result, foreign objects which might have stuck to the portion of the insulating layer corresponding the light receiving area of the solid-state imaging element in the wiring layer forming step are removed together with the insulating layer in the subsequent insulating layer removing step. Therefore, with the foregoing manufacturing method, operations which might pose the risk of sticking foreign objects during the manufacturing process can be eliminated as much as possible to realize a manufacturing process of high productivity, thereby inexpensively providing a high-quality solid-state imaging device for products which incorporate solid-state imaging devices, for which demand for reducing the size and thickness has not been higher.

Further, the wiring layer formed in the wiring forming step is formed on the transparent substrate via the insulating layer which is formed in the insulating layer forming step, instead of directly forming it on the transparent substrate. Thus, it is possible to easily carry out patterning without damaging the surface of the light receiving area of the transparent substrate in patterning of wiring of the wiring layer, thus obtaining desirable adhesion between the transparent substrate and the wiring layer.

Further, in the manufacturing method of the solid-state imaging device, it is preferable that, in the wiring layer forming step, recognition marks are formed at the same time as patterning the wiring layer, and, in the bonding step, alignment is taken using as a reference the recognition marks and alignment marks formed on the solid-state imaging element so as to connect electrodes of the solid-state imaging element and solid-state imaging element connecting terminals of the wiring pattern.

According to this method, the recognition marks can be formed at the time of forming the wiring pattern, thus making the method efficient.

Further, in the manufacturing method of the solid-state imaging device, it is preferable that the wiring pattern formed in the wiring layer forming step is made of an Al alloy material, and the solid-state imaging element has projecting electrodes as electrodes to be connected to the wiring, and in the bonding step, the projecting electrodes of the solid-state imaging element and solid-state imaging element connecting terminals of the wiring pattern are connected to each other by an ultrasonic connection technique.

According to this method, in the bonding step, the projecting electrodes of the solid-state imaging element are bonded with the solid-state imaging element connecting terminals of the wiring pattern by the ultrasonic connection method, and since the wiring on the side of the transparent substrate is made of an alloyed material containing aluminium which has a high diffusion coefficient, bonding can easily be made at a low temperature of around 100° C. at the most, thereby realizing low-temperature connection. Further, since bonding is made by forming an alloy only by applying a ultrasonic wave, high throughput is realized.

Further, because the ultrasonic connection method, instead of the conductive adhesive, is used to connect the solid-state imaging element with the transparent substrate, there will be no adhesive which has not been set on the surface of the solid-state imaging element immediately before mounting. This allows for provision of a step of removing foreign objects by washing, etc., immediately before mounting the solid-state imaging element. As a result, it is possible to eliminate foreign objects sticking to the light receiving surface of the solid-state imaging element as much as possible, thus reducing defects due to foreign objects sticking to the light receiving area.

Further, in the manufacturing method of the solid-state imaging device, it is preferable that the solid-state imaging device is made by dividing a plurality of solid-state imaging devices formed in a matrix on a single transparent substrate base material into individual pieces by a dicing process, and the method further comprises between the bonding step and the dicing process a step of forming a sealing resin around the solid-state imaging element, after placing a mask having an aperture larger than the solid-state imaging element from the side of a transparent substrate base material from which the solid-state imaging element is mounted, by injecting a resin into a gap between the solid-state imaging element and the aperture of the mask by a printing method.

According to this method, it is possible to prevent the sealing resin from spreading around the solid-state imaging element, which allows the size of the solid-state imaging device to be reduced. That is, in the case where a conventionally employed potting method is used to form the sealing resin, the sealing resin which was potted spreads around the solid-state imaging element, which becomes a disadvantage in reducing size of the solid-state imaging element. The potting method in which the resin is dropped from above may alternatively be used instead of the printing method.

In the printing method, the sealing resin is injected into a gap between the solid-state imaging element and the aperture of the mask slightly larger than the solid-state imaging element, thus preventing spreading of the sealing resin by the mask.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A manufacturing method of a solid-state imaging device, comprising the steps of:
   (1) forming an insulating layer on a transparent substrate;
   (2) forming a wiring layer having a predetermined pattern on the insulating layer;
   (3) uncovering a surface of a light receiving area of the transparent substrate after forming the wiring layer by removing a portion of the insulating layer formed in said step (1) corresponding to a light receiving area of a solid-state imaging element; and
   (4) bonding the solid-state imaging element with the wiring layer so as to mount the solid-state imaging element on the transparent substrate.

2. The method as set forth in claim 1, wherein, in said step (2), recognition marks are formed at the same time as patterning the wiring layer, and, in said step (4), alignment is taken using as a reference the recognition marks and alignment marks formed on the solid-state imaging element so as to connect electrodes of the solid-state imaging element and solid-state imaging element connecting terminals of the wiring pattern.

3. The method as set forth in claim 1, wherein:
   the wiring pattern formed in said step (2) is made of an Al alloy material, and the solid-state imaging element has projecting electrodes as electrodes to be connected to the wiring, and
   in said step (4), the projecting electrodes of the solid-state imaging element and solid-state imaging element connecting electrodes of the wiring pattern are connected to each other by an ultrasonic connection technique.

4. The method as set forth in claim 1, wherein:
   said solid-state imaging device is made by dividing a plurality of solid-state imaging devices formed in a matrix on a single transparent substrate base material into individual pieces by a dicing process, and
   said method further comprises between said step (4) and the dicing process a step of forming a sealing resin around the solid-state imaging element, after placing a mask having an aperture larger than the solid-state imaging element from the side of a transparent substrate base material from which the solid-state imaging element is mounted, by injecting a resin into a gap between the solid-state imaging element and the aperture of the mask by a printing method.

5. The method as set forth in claim 1, further comprising the steps of:
   (a) forming a light-shielding metal film on the insulating layer between said step (1) and said step (2); and
   (b) removing a portion of the light-shielding metal film formed in said step (a) corresponding to the light receiving area of the solid-state imaging element.

6. The method as set forth in claim 5, wherein, in said step (b), a portion of the light-shielding metal film outside a portion thereof facing the solid-state imaging element is partially removed to have a reference pin position when removing the portion of the light-shielding metal film corresponding to the light receiving area of the solid-state imaging element.

7. A solid-state imaging device which is manufactured by a method which includes the steps of:
   (1) forming an insulating layer on a transparent substrate;
   (2) forming a wiring layer having a predetermined pattern on the insulating layer;
   (3) uncovering a surface of a light receiving area of the transparent substrate after forming the wiring layer by removing a portion of the insulating layer formed in said step (1) corresponding to a light receiving area of a solid-state imaging element; and
   (4) bonding the solid-state imaging element with the wiring layer so as to mount the solid-state imaging element on the transparent substrate.

8. The solid-state imaging device as set forth in claim 7, wherein the wiring layer is made of an Al alloy material.

9. The solid-state imaging device as set forth in claim 7, wherein an outer periphery of the solid-state imaging element is covered with a sealing resin.

10. The solid-state imaging device as set forth in claim 9, wherein a viscosity of the sealing resin is not less than 150 Pa·s and not more than 250 Pa·s.

* * * * *